United States Patent [19]
Ju

[11] Patent Number: 5,943,565
[45] Date of Patent: Aug. 24, 1999

[54] CMOS PROCESSING EMPLOYING SEPARATE SPACERS FOR INDEPENDENTLY OPTIMIZED TRANSISTOR PERFORMANCE

[75] Inventor: Dong-Hyuk Ju, Cupertino, Calif.

[73] Assignee: Advanced Micro Devices, Inc., Sunnyvale, Calif.

[21] Appl. No.: 08/924,640

[22] Filed: Sep. 5, 1997

[51] Int. Cl.⁶ .............................................. H01L 21/8238
[52] U.S. Cl. .......................................... 438/231; 438/232
[58] Field of Search .................................. 438/231, 232, 438/228, 229, 233, 300, 592, 227, 223, 224, 530, FOR 216, FOR 217, FOR 218, FOR 168

[56] References Cited

U.S. PATENT DOCUMENTS

| | | | |
|---|---|---|---|
| 4,637,124 | 1/1987 | Okuyama et al. | 438/231 |
| 4,891,326 | 1/1990 | Koyanagi | 438/231 |
| 5,169,796 | 12/1992 | Murray et al. | 438/232 |
| 5,278,441 | 1/1994 | Kang et al. | 438/231 |
| 5,438,008 | 8/1995 | Ema | 438/305 |
| 5,610,088 | 3/1997 | Chang et al. | 438/231 |
| 5,654,212 | 8/1997 | Jang | 438/231 |
| 5,714,413 | 2/1998 | Brigham et al. | 438/305 |
| 5,747,373 | 5/1998 | Yu | 438/306 |
| 5,786,247 | 7/1998 | Chang et al. | 438/231 |

*Primary Examiner*—Michael Trinh

[57] ABSTRACT

N-channel and P-channel transistor performances are separately optimized by activating the source/drain regions of the N-channel transistor before forming the P-channel lightly doped implant. Separate sidewall spacers for the moderately or heavily doped implants of the N- and P-channel transistors are employed. Embodiments enable independent control of the junction depths and channel lengths of N- and P-channel transistors.

16 Claims, 2 Drawing Sheets

CMOS PROCESSING EMPLOYING SEPARATE SPACERS FOR INDEPENDENTLY OPTIMIZED TRANSISTOR PERFORMANCE

TECHNICAL FIELD

The present invention relates to a method of manufacturing a CMOS semiconductor device with independently optimized transistor performance. The invention has particular applicability in manufacturing high density CMOS semiconductor devices with design features of 0.25 microns and under.

BACKGROUND ART

The escalating requirements for high densification and performance associated with ultra large scale integration semiconductor devices requires design features of 0.25 microns and under, such as 0.18 microns and under, increased transistor and circuit speeds, high reliability and increased manufacturing throughput for competitiveness. The reduction of design features to 0.25 microns and under challenges the limitations of conventional semiconductor manufacturing techniques.

In order to reduce the number of manufacturing steps, such as masking, thereby increasing manufacturing throughput, the N-channel and P-channel transistors of a CMOS semiconductor device are conventionally exposed to similar processing conditions, such as spacer formation on the sidewalls of gate electrodes and heat treatment. Typically, the entire semiconductor wafer is placed in a furnace and subjected to heat treatment when activation annealing for converting impurity implants into source/drain regions. The economic advantage attendant upon increased manufacturing throughput comes at a price, however, in that the performance characteristics of the N-channel transistor and P-channel transistor cannot be individually tailored or optimized. For example, the diffusion coefficients of P-type impurity atoms, such as boron, are typically greater than those of N-type impurity atoms. During activation annealing of the N-channel transistor source/drain regions, the P-channel lightly doped implants are subjected to elevated temperatures and, hence, undergo diffusion. Accordingly, it is difficult to form the P-channel transistor with a shallow lightly doped junction depth ($X_J$).

As design features shrink to less than about 0.25 microns, the disadvantages attendant upon uniform processing of N-channel and P-channel transistors of a CMOS semiconductor device are exacerbated. For example, for design features of about 0.25 microns, it is necessary to significantly reduce the $X_J$ to less than about 800 Å. This, in itself, is difficult to achieve, let alone in a P-channel transistor of a CMOS device employing conventional methodology comprising activation annealing to activate both the N-channel transistor and P-channel transistor implants to form source/drain regions. In addition, it is generally desirable to form the P-channel transistor with a channel region having a channel length greater than that of the channel region of the N-channel transistor, particularly in semiconductor devices having sub-micron features, to avoid the short channel effect characteristic of P-type transistors.

Conventional methodology for manufacturing a CMOS device comprises separately ion implanting to form N-channel and P-channel lightly doped implants using the N-channel transistor gate electrode and P-channel transistor gate electrode as masks, respectively. Subsequently, dielectric sidewall spacers are formed on the side surfaces of both gate electrodes. The P-channel transistor is then typically masked and N-type impurities are ion implanted into the semiconductor substitute using the gate electrode and sidewall spacers thereon as a mask to form moderately or heavily doped implants. High temperature activation annealing is then conducted to activate the N-channel source/drain regions, typically at about 1050° C. for about 30 seconds, i.e., rapid thermal annealing (RTA). During activation annealing, the implanted N-type impurities diffuse into the proper lattice sites and implantation damage is reduced, thereby reducing junction leakage. The N-type impurity implants are generally activated at higher temperatures than those employed to activate the P-channel implants, since the N-channel implants are typically more difficult to activate than the P-channel source/drain implants. However, at the time of high temperature activation annealing to form the N-channel source/drain regions, the lightly doped P-channel implants diffuse to a great extent as P-type impurities typically diffuse significantly faster than N-type impurities. Subsequently, the N-channel transistor region is masked and P-type impurities are ion implanted to form moderately or heavily doped implants. Activation annealing is then conducted, at a temperature of about 1000° C., to activate the P-channel source/drain regions.

In practicing such conventional methodology, the lightly doped P-channel implants are exposed to both the N-channel activation annealing and the P-channel activation annealing, thereby undesirably increasing the $X_J$ beyond the targeted maximum of about 800 Å. Accordingly, there exists a need for semiconductor methodology enabling independent optimization of performance for N-channel and P-channel transistors of a CMOS device, particularly in forming P-channel transistors having a shallow $X_j$.

DISCLOSURE OF THE INVENTION

An object of the present invention is a method of manufacturing a CMOS device with independent control of the N-channel and P-channel transistor characteristics.

Another object of the present invention is a method of manufacturing a CMOS semiconductor device with design features of 0.25 microns and under with independent control of the $X_j$ of the P-channel transistor.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device comprising an N-channel transistor and P-channel transistor, which method comprises: forming a dielectric layer on a surface of a semiconductor substrate; forming a conductive layer on the dielectric layer; patterning the conductive layer to form a first gate electrode of the N-channel transistor and a second gate electrode of the P-channel transistor, each gate electrode having an upper surface and side surfaces; using the first gate electrode as a mask, implanting impurities to form N-type lightly doped implants in the semiconductor substrate; forming first insulating sidewall spacers on the side surfaces of the first and second gate electrodes; using the first gate electrode and first insulating sidewall spacers as a mask, implanting impurities to form N-type moderately doped or heavily doped implants in the semiconductor substrate; activation annealing at a first temperature to form source/drain regions of the N-channel transistor comprising N-type lightly doped and moderately or heavily doped portions, the lightly doped portions extending below the surface of the semiconductor substrate to a first depth less than the second depth of the N-type moderately or heavily doped portions; using the second gate electrode and first insulating sidewall spacers as a mask, ion implanting impurities to form P-type lightly doped implants in the semiconductor substrate; forming second insulating sidewall spacers on the first insulating sidewall spacers on the side surfaces of the second gate electrode; using the second gate electrode and first and second insulating sidewall spacers thereon as a mask, implanting impurities to form P-type moderately or heavily doped implants in the semiconductor substrate; and activation annealing at a second temperature to form source/drain regions of the P-channel transistor comprising P-type lightly doped and moderately or heavily doped portions, the P-type lightly doped portions extending below the semiconductor substrate to a third depth less than the fourth depth of the P-type moderately or heavily doped portions.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
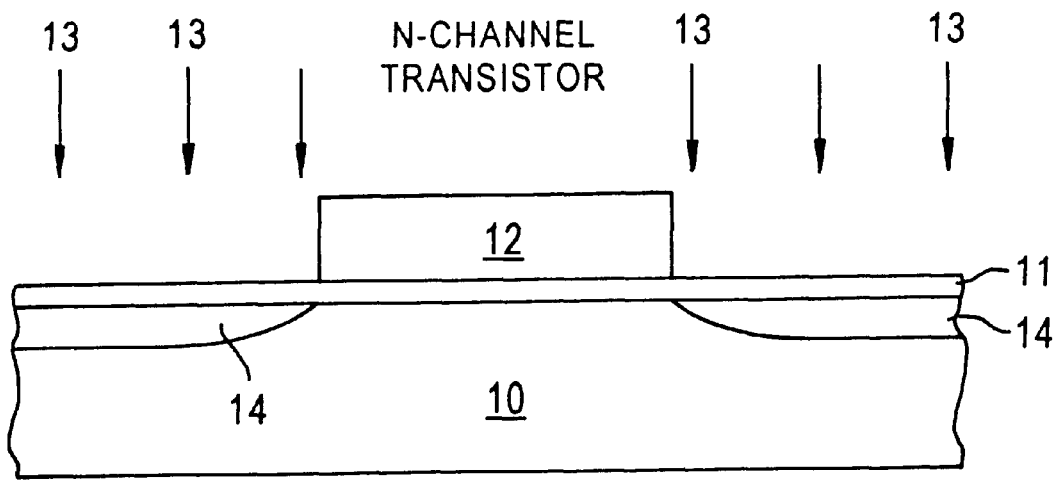
FIGS. 1 through 4 represent sequential stages in a method of manufacturing a semiconductor device according to an embodiment of the present invention.

The present invention provides methodology enabling independent control of N- and P- channel transistor characteristics while achieving high production throughput in manufacturing a CMOS semiconductor device. Advantageously, the present invention enables control of the $X_J$ of the P-channel transistor independently of the $X_J$ of the N-channel transistor. The present invention also provides greater independent control of the respective lengths of the channel regions of the N-channel and P-channel transistors.

In accordance with the present invention, the source/drain regions of the P-channel and N-channel transistors are formed independently, thereby enabling independent optimization of the N-channel and P-channel transistors, particularly the channel length and $X_J$ of the P-channel transistor. This objective is achieved by the strategic formation of sidewall spacers on the side surfaces of the gate electrodes of the N-channel and P-channel transistors.

In accordance with an embodiment of the present invention, as in conventional practices, the P-channel transistor region is masked and ion implantation is conducted to form the N-channel implants using the gate electrode of the N-channel transistor as a mask. The present invention departs from such conventional CMOS methodology by forming a sidewall spacer on the side surfaces gate electrodes of the N-channel and P-channel transistors. The sidewall spacers are formed in a conventional manner as by chemical vapor deposition (CVD) of an insulating material, such as a silicon oxide, a silicon nitride or a silicon oxynitride, at a suitable thickness and anisotropically etching. The sidewall spacers are formed at a targeted width, such as about 300 Å to about 1,000 Å, to achieve a targeted channel length. Anisotropic etching can be performed so that a portion of the underlying gate dielectric layer remains to serve as an oxide screen for subsequent moderate or heavy ion implantations. Alternatively, a thermal oxide screen layer can be grown or, preferably, vapor deposited as disclosed in application Ser. No. 08/924,639 filed Sep. 5, 1997, pending, to minimize transient enhanced diffusion of implanted impurities.

While maintaining the P-channel region masked, N-type impurities are ion implanted to form moderately or heavily doped implants. Subsequently, activation annealing is conducted, such as RTA, at a temperature of about 1,000° C. to about 1,100° C., e.g., 1050° C., for about 10 seconds to about 45 seconds, e.g., 30 seconds, to activate the light and moderately or heavily doped implants to form the source/drain regions of the N-channel transistor. In accordance with the present method, P-type lightly doped impurities are not implanted into the semiconductor substrate in the P-channel transistor region until after activation annealing to form the N-channel source/drain regions. Accordingly, lightly doped P-channel implants are not subjected to the more severe activation annealing to form the N-channel transistor source/drain regions.

After formation of the N-channel transistor source/drain regions, the N-channel transistor region is masked and P-type impurities are ion implanted to form lightly doped P-channel implants using the P-channel gate electrode and first sidewall spacers thereon as a mask. Subsequently, second sidewall spacers, having a predetermined width, are formed on the first sidewall spacers, in a manner similar to forming the first sidewall spacers, e.g., CVD of a silicon oxide, a silicon nitride or a silicon oxynitride film followed by anisotropic etching. As in forming the first sidewall spacers, a portion of the gate dielectric layer can be left to serve as a screen oxide layer. Alternatively, thermal oxidation can conducted to form a screen oxide layer. However, it is preferred to leave a portion of the original gate dielectric layer or deposit an oxide layer by PECVD as in copending application Ser. No. 08/924,639 filed Sep. 5, 1997, pending, to minimize transient enhanced diffusion.

After forming the second sidewall spacers on the P-channel transistor gate electrode, P-type impurities are ion implanted to form moderately or heavily doped implants. Activation annealing is then conducted, as at a temperature of about 900° C. to about 1,000° C., e.g., about 1000° C., for about 10 seconds to about 45 seconds, e.g., 30 seconds, to activate the source/drain regions of the P-channel transistor. In accordance with the present invention, the lightly doped P-channel implants are exposed to a single activation annealing step, thereby controlling the $X_J$ vis-à-vis conventional practices wherein the P-channel lightly doped implants are subjected to the high temperature activation annealing to form the N-channel transistor source/drain regions as well as activation annealing to form the P-channel transistor source/drain regions. Thus, the present invention enables the $X_J$ for the N-channel transistor and the $X_J$ for the P-channel transistor to be independently tailored or optimized, as by suitable selection of the implantation conditions and activation temperature. In addition, the thickness of sidewall spacers can be selected to optimize the length of the N- and P-channel transistor channel regions.

Figure 2:
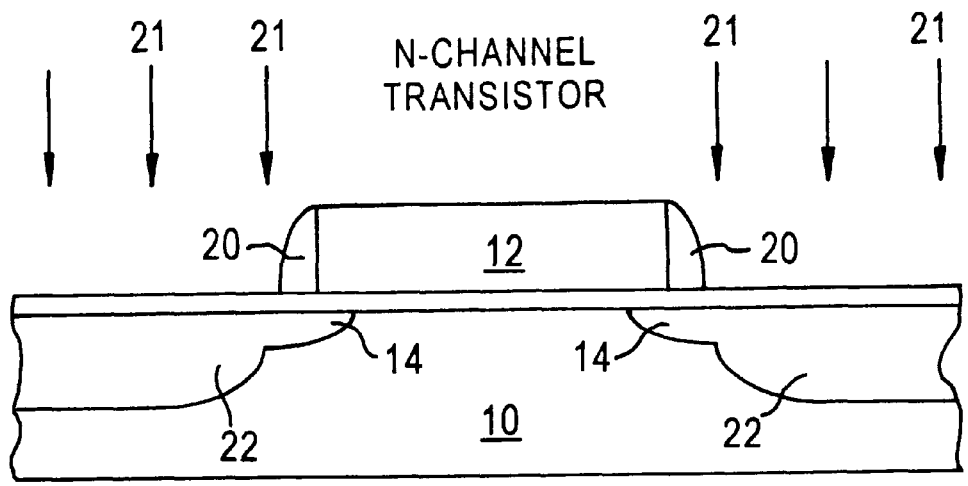
Figure 3:
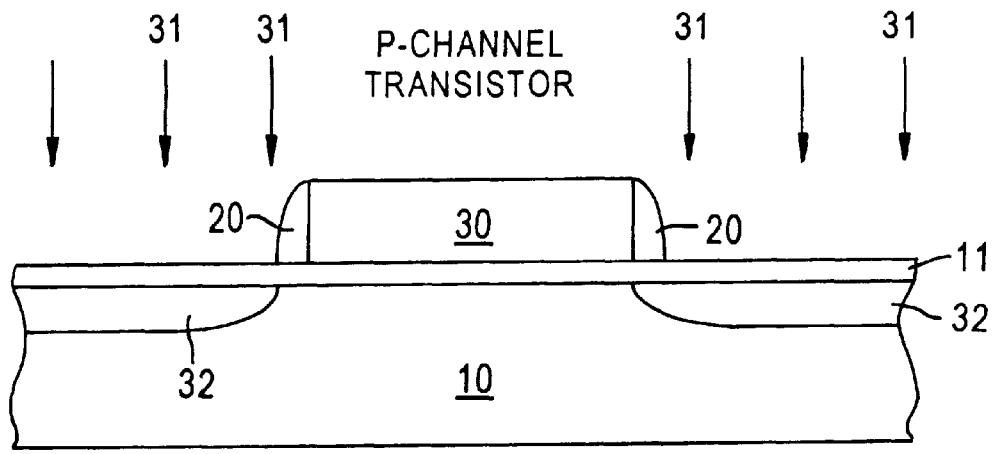
Figure 4:
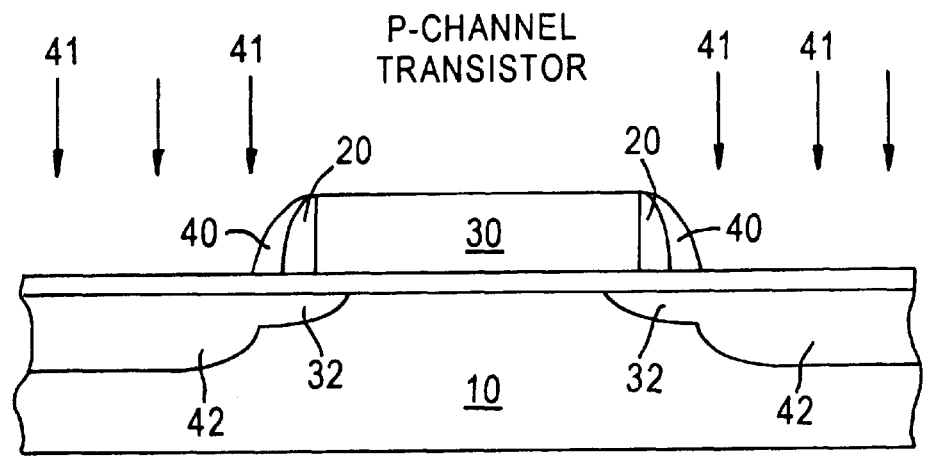

An embodiment of the present invention is illustrated in FIGS. 1 through 4, wherein similar reference numerals denote similar features. Adverting to FIG. 1, a gate dielectric layer 11, such as silicon oxide, is formed on semiconductor substrate 10, typically comprising doped monocrystalline silicon. A conductive layer, e.g., doped polycrystalline silicon, is deposited on gate oxide layer 11 and patterned in a conventional manner to form gate electrode 12 of the N-channel transistor (FIG. 1) and gate electrode 30 of the P-channel transistor (FIG. 3). N-channel impurities are then ion implanted, as indicated by arrows 13, using gate electrode 12 as a mask to form lightly doped implants 14. A layer of insulating material, such as a silicon oxide, a silicon nitride or a silicon oxynitride, is deposited, e.g., by CVD, followed by anisotropic etching to form first sidewall spacers 20 on the side surfaces of gate electrode 12, as shown in FIG. 2, and on the side surfaces of gate electrode 30, as shown in FIG. 3.

Adverting to FIG. 2, N-type impurities are ion implanted, as indicated by arrows 21, using gate electrode 12 and sidewall spacers 20 thereon as a mask, to form N-channel moderately or heavily doped implants 22. The implantation energies and dosages employed in forming the N-channel lightly and moderately or heavily doped implants are optimized for N-channel transistor performance. For example, the N-channel impurities are typically implanted at a dosage of about $5 \times 10^{13}$ atoms cm$^{-2}$ to about $5 \times 10^{14}$ atoms cm$^{-2}$ and at an energy of about 10 KeV to about 20 KeV to form the lightly doped implants, and at a dosage of about $5 \times 10^{14}$ atoms cm$^{-2}$ to about $5 \times 10^{15}$ atoms cm$^{-2}$ and at an energy of about 40 KeV to about 60 KeV to form the moderate or heavily doped channel implants. After forming the N-channel moderately or heavily doped implants, RTA is conducted at a temperature of about 1050° C. for about 30 seconds to activate the source/drain regions of the N-channel transistor.

Adverting to FIG. 3, after activating the N-channel transistor source/drain regions, P-type impurities are implanted, as indicated by arrows 31, using gate electrode 30 and sidewall spacers 20 thereon as a mask, to form lightly doped implants 32. The width of the first sidewall spacers 20 is selected to optimize the channel length of the P-channel transistor channel region, giving due consideration for diffusion after activation annealing.

Second sidewall spacers 40 are then formed on first sidewall spacers 20 on the P-channel gate electrode 30 and, for optimum manufacturing throughput, the first sidewall spacers of the N-channel gate electrode 12. Second sidewall spacers can also be formed by depositing an insulating layer on the N-channel transistor and P-channel transistor regions and isotropically etching. The width of the second sidewall spacer 40 is also selected for optimum channel length of the P-channel transistor to minimize the short channel effect. P-type impurities are then ion implanted, as indicated by arrows 41, utilizing gate electrode 30, first sidewall spacers 20 and second sidewall spacers 40 thereon as a mask, to form moderately or heavily doped implants 42. In practicing the present invention, the dosages and energies of P-type impurity ion implantations are selected for optimum P-channel transistor performance, notably $X_J$. For example, the P-type impurities are typically ion implanted at a dosage of about $5 \times 10^{13}$ atoms cm$^{-2}$ to about $5 \times 10^{14}$ atoms cm$^{-2}$ and at an energy of about 5 KeV to about 10 KeV to form the lightly doped implants, while P-type impurities are typically ion implanted at a dosage of about $5 \times 10^{14}$ atoms cm$^{-2}$ to about $5 \times 10^{15}$ atoms cm$^{-2}$ and at an energy of about 20 KeV to about 40 KeV to form the moderately or heavily doped implants. Activation annealing is then conducted to form the source/drain regions of the P-channel transistor, as at a temperature of about 1,000° C. for a period of about 30 seconds.

The inventive methodology enables optimization of the channel length and $X_J$ of the P-channel transistor without being tied to processing conditions required to optimize performance of the N-channel transistor. The present invention provides a wide degree of selectivity for the width of the sidewall spacers. In accordance with the present invention, the $X_J$ for the P-channel transistor can be controlled to a depth of about 500 Å to about 800 Å, e.g., less than about 800 Å, without compromising the optimum performance characteristics of the N-channel transistor.

Thus, in accordance with the present invention, the performance of the N-channel transistor and P-channel transistor are optimized independently, particularly the channel length and the $X_J$ of the P-channel transistor, while maintaining optimum N-channel transistor performance. The present invention involves the strategic employment of sidewall spacers having a width selected to optimize performance of the P-channel transistor. Implantation dosages and activation annealing conditions are selected for independent optimization for the N-channel transistor and P-channel transistor. The present invention is applicable to the production of various types of semiconductor devices, particularly high density semiconductor devices with submicron features of about 0.25 microns and below, exhibiting high speed characteristics and improved reliability. The present invention is cost effective and can easily be integrated into conventional processing.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a CMOS semiconductor device comprising an N-channel transistor and P-channel transistor, which method comprises sequentially:

forming a dielectric layer on a surface of a semiconductor substrate;

forming a conductive layer on the dielectric layer;

patterning the conductive layer to form a first gate electrode of the N-channel transistor and a second gate electrode of the P-channel transistor, each gate electrode having an upper surface and side surfaces;

using the first gate electrode as a mask, implanting impurities to form N-type lightly doped implants in the semiconductor substrate;

forming first insulating sidewall spacers on the side surfaces of the first and second gate electrodes;

using the first gate electrode and first insulating sidewall spacers as a mask, implanting impurities to form N-type moderately doped or heavily doped implants in the semiconductor substrate;

activation annealing at a first temperature to form source/drain regions of the N-channel transistor comprising N-type lightly doped and moderately or heavily doped portions, the lightly doped portions extending below the surface of the semiconductor substrate to a first depth and the N-type moderately or heavily doped portions extending below the surface of the semiconductor substrate to a second depth greater than the first depth;

using the second gate electrode and first insulating sidewall spacers as a mask, ion implanting impurities to form P-type lightly doped implants in the semiconductor substrate;

forming second insulating sidewall spacers on the first insulating sidewall spacers on the side surfaces of the second gate electrode;

using the second gate electrode and first and second insulating sidewall spacers thereon as a mask, implanting impurities to form P-type moderately or heavily doped implants in the semiconductor substrate; and activation annealing at a second temperature to form source/drain regions of the P-channel transistor comprising P-type lightly doped and moderately or heavily doped portions, the P-type lightly doped portions extending below the semiconductor substrate to a third depth and the P-type moderately or heavily doped portions extending below the semiconductor substrate to a fourth depth greater than the third depth.

2. The method according to claim 1, wherein the semiconductor substrate comprises monocrystalline silicon and the dielectric layer comprises silicon oxide.

3. The method according to claim 2, wherein the conductive layer comprises doped polycrystalline silicon.

4. The method according to claim 1, comprising ion implanting impurities at a dosage of about $5 \times 10^{13}$ atoms cm$^{-2}$ to about $5 \times 10^{14}$ atoms cm$^{-2}$ and at an energy of about 10 KeV to about 20 KeV to form the N-type lightly doped implants.

5. The method according to claim 4, comprising ion implanting impurities at a dosage of about $5 \times 10^{14}$ atoms cm$^{-2}$ to about $5 \times 10^{15}$ atoms cm$^{-2}$ and at an energy of about 40 KeV to about 60 KeV to form the N-type moderately or heavily doped implants.

6. The method according to claim 1, comprising ion implanting impurities at a dosage of about $5 \times 10^{13}$ atoms cm$^{-2}$ to about $5 \times 10^{14}$ atoms cm$^{-2}$ and at an energy of about 5 KeV to about 10 KeV to form the P-type lightly doped implants.

7. The method according to claim 6, comprising ion implanting impurities at a dosage of about $5 \times 10^{14}$ atoms cm$^{-2}$ to about $5 \times 10^{15}$ atoms cm$^{-2}$ and at an energy of about 20 KeV to about 40 KeV to form the P-type moderately or heavily doped implants.

8. The method according to claim 1, wherein the first and second sidewall spacers are each formed by depositing a layer of insulating material and etching.

9. The method according to claim 6, wherein the insulating material is a silicon oxide, a silicon nitride or a silicon oxynitride.

10. The method according to claim 1, wherein the second temperature is less than the first temperature.

11. The method according to claim 10, wherein the first temperature is about 1,000° C. to about 1,100° C., and the second temperature is about 900° C. to about 1,000° C.

12. The method according to claim 1, wherein the first depth is about 500 Å to about 800 Å, and the third depth is about 500 Å to about 800 Å.

13. The method according to claim 1, wherein the second insulating sidewall spacer is also formed on the first insulating sidewall spacer on the side surfaces of the first gate electrode.

14. The method according to claim 1, wherein the first and second insulating sidewall spacers have different thicknesses.

15. The method according to claim 1, wherein the P-type impurity comprises boron.

16. The method according to claim 1, wherein the first and second insulating sidewall spacers comprise different materials.

* * * * *